United States Patent [19]

Mochizuki et al.

[11] Patent Number: 4,601,017
[45] Date of Patent: Jul. 15, 1986

[54] SEMICONDUCTOR MEMORY DEVICE HAVING ACTIVE PULL-UP CIRCUITS

[75] Inventors: Hirohiko Mochizuki, Kawasaki; Yoshihiro Takemae, Tokyo; Tomio Nakano, Kawasaki; Kimiaki Sato, Tokyo, all of Japan

[73] Assignee: Fujitsu Limited, Kawasaki, Japan

[21] Appl. No.: 561,964

[22] Filed: Dec. 15, 1983

[30] Foreign Application Priority Data

Dec. 22, 1982 [JP] Japan .................. 57-223678

[51] Int. Cl.$^4$ .................. G11C 11/40; G11C 7/00
[52] U.S. Cl. .................. 365/189; 365/203; 365/205; 365/222
[58] Field of Search ............ 365/174, 203, 204, 205, 365/207, 208, 222, 189

[56] References Cited

U.S. PATENT DOCUMENTS

| 4,028,557 | 6/1977 | Wilson | 365/205 |
| 4,262,342 | 4/1981 | Tuan | 365/203 |
| 4,481,610 | 11/1984 | Takemae et al. | 365/222 |
| 4,504,929 | 3/1985 | Takemae et al. | 371/21 |

FOREIGN PATENT DOCUMENTS 53-120238 10/1978 Japan .
0030192 2/1982 Japan .................. 365/203

Primary Examiner—James W. Moffitt
Assistant Examiner—Glenn A. Gossage
Attorney, Agent, or Firm—Staas & Halsey

[57] ABSTRACT

A semiconductor memory device comprises active pull-up circuits ($APU_1$, $APU_2$) each provided for one bit line ($BL_1$, $\overline{BL_1}$). Each active pull-up circuit ($APU_1$) has connections to two bit lines. That is, an active pull-up circuit ($APU_1$) for a first bit line ($BL_1$) comprises a first transistor ($Q_1$) connected between a power supply terminal ($V_{CC}$) and the first bit line, a second transistor ($Q_2$) connected between the gate of the first transistor and the first bit line, and a capacitor ($C_1$) connected to the gate of the first transistor. The gate of the second transistor is connected to a second bit line ($\overline{BL_1}$) which is paired with the first bit line. The capacitor receives an active pull-up signal ($\phi_{AP}$). A circuit ($Q_3$, $Q_4$, $Q_5$) is provided for transmitting a high level potential to the gate ($N_1$) of the first transistor to precharge the capacitor.

8 Claims, 30 Drawing Figures

Fig. 6
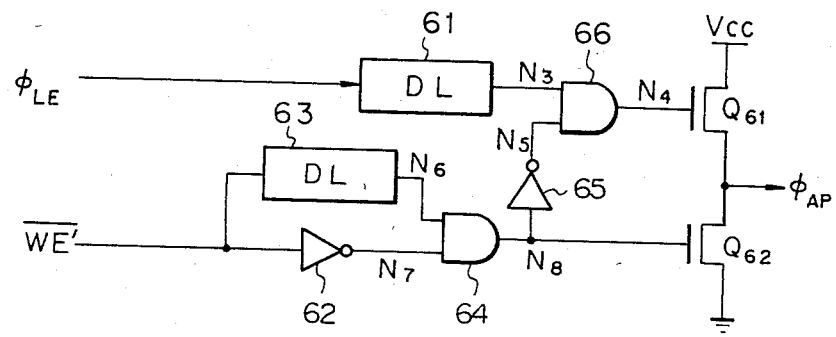
Fig. 7A   $\phi_{LE}$
Fig. 7B   $\overline{WE'}$
Fig. 7C   $N_3$
Fig. 7D   $N_4$
Fig. 7E   $N_5$
Fig. 7F   $N_6$
Fig. 7G   $N_7$
Fig. 7H   $N_8$
Fig. 7I   $\phi_{AP}$

SEMICONDUCTOR MEMORY DEVICE HAVING ACTIVE PULL-UP CIRCUITS

BACKGROUND OF THE INVENTION

1. Field of the Invention

The present invention relates to a semiconductor memory device and, more particularly, to an active, or more broadly a metal-insulator semiconductor (MIS), pull-up circuit of a metal-oxide semiconductor (MOS) dynamic random access memory (RAM) device.

2. Description of the Prior Art

In dynamic RAM devices in which one-transistor one-capacitor type memory cells are primarily used, one sense amplifier for read operations is provided for each bit line pair. When a memory cell is selected, it generates only a small difference in potential between a pair of bit lines. The sense amplifier enlarges, i.e., amplifies the above-mentioned small difference in potential by pulling down the potential of the lower of the bit lines. However, when this occurs, the higher potential falls a little due to discharge at the sense amplifier immediately after the start of the sense operation, leakage currents after the completion of the operation, and the like. This is a disadvantage because the potential level for rewriting data into a memory cell is low. Therefore, an active pull-up circuit is used to pull up the higher potential of the bit lines.

An active pull-up circuit for each bit line basically comprises three elements, i.e., a first transistor connected between the bit line and a power supply, a second transistor connected between the gate of the first transistor and the bit line, and a capacitor connected to the gate of the first transistor. In order to drive this active pull-up circuit, a clock signal for controlling the gate potential of the second transistor, and a clock signal for controlling the capacitor potential are necessary. However, in recent years, an active pull-up circuit has been proposed in which the gate of the second transistor is connected to the bit line which shares the sense amplifier, so that the gate potential of the second transistor is controlled by the potential of this bit line. (See Japanese Unexamined Patent Publication (Kokai) No.53-120238). Such an active pull-up circuit connected to both bit lines in a pair has an advantage in that the control is simpler, since the number of clock signals is reduced.

In the above-mentioned active pull-up circuit connected to two bit lines, as will be explained in detail later, when a write operation for "reverse" data, opposite to that just sensed, is carried out on the same bit line pair after an active pull-up operation, it is impossible to carry out an active pull-up operation for the write operation. Therefore, the higher potential is not pulled up, which effects the following refresh operation. In addition, if the higher potential is reduced, the stored information can be erased.

SUMMARY OF THE INVENTION

It is an object of the present invention to provide a semiconductor memory device having active pull-up circuits, each of which is connected to two bit lines, in which an active pull-up operation is possible when a write operation for reverse data is carried out after an active pull-up operation.

According to the present invention, a circuit for transmitting the higher potential of the bit lines to the gate of the first transistor is provided.

BRIEF DESCRIPTION OF THE DRAWINGS

The present invention will be more clearly understood from the description as set forth below with reference to the accompanying drawings.

FIG. 6 is a diagram of a circuit for generating the pull-up signal $\phi_{AP}$ in FIG. 4;

FIGS. 7A through 7I are timing diagrams of the operation of the circuit in FIG. 6.

DESCRIPTION OF THE PREFERRED EMBODIMENTS

Figure 1:
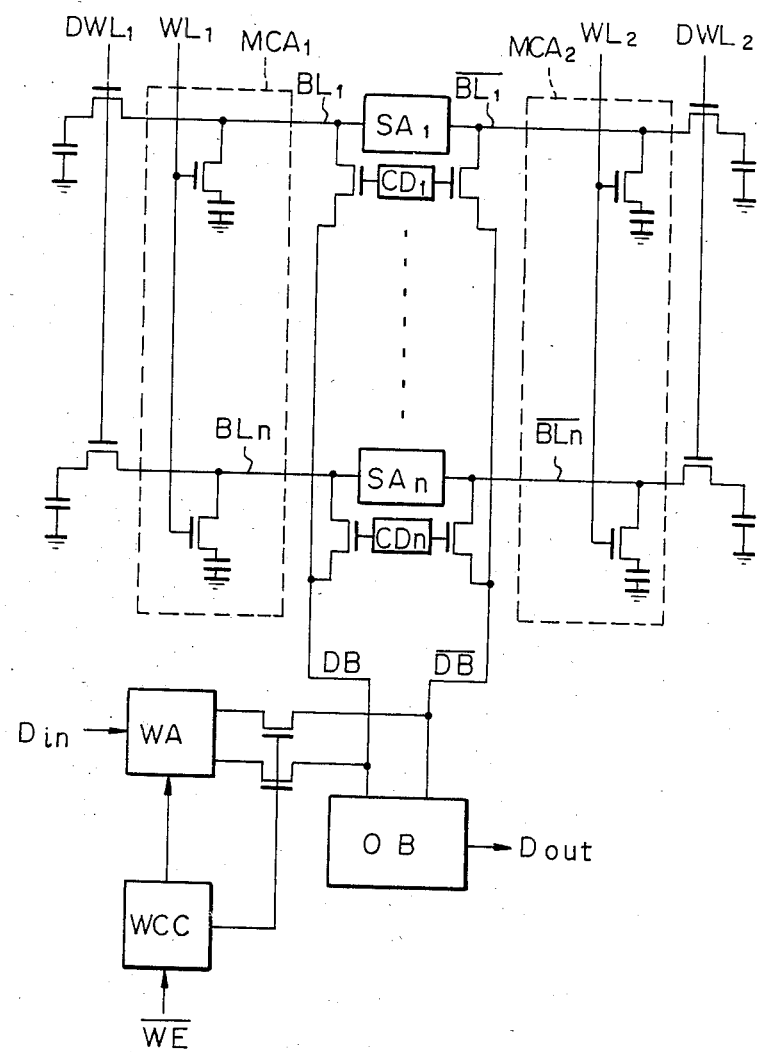
FIG. 1 is a diagram of a general dynamic RAM device.

In FIG. 1, an illustration of a general dynamic RAM device, sense amplifiers $SA_1$ to $SA_n$ are arranged between memory cell arrays $MCA_1$ and $MCA_2$ in which a large number of memory cells of a one-transistor one-capacitor type are arranged in a matrix, and bit line pairs $BL_1$ and $\overline{BL}_1$; ...; and $BL_n$ and $\overline{BL}_n$ are connected to both sides of the sense amplifiers $SA_1$ through $SA_n$. A memory cell is provided at each intersection between the bit lines $BL_1$, $\overline{BL}_1$, ..., $BL_n$ and $\overline{BL}_n$, and the word lines $WL_1$, $WL_2$, ..., $WL_n$. In addition, a dummy cell is provided at each intersection between the bit lines $BL_1$, $\overline{BL}_1$, ..., $BL_n$, $\overline{BL}_n$, and dummy word lines $DWL_1$ and $DWL_2$.

Column decoders $CD_1$ through $CD_n$ are provided for the bit lines $BL_1$, $\overline{BL}_1$, ..., $BL_n$, and $\overline{BL}_n$. One row of memory cells are selected by one of the word lines, and each of the data signals derived from the cells on the corresponding bit lines $BL_1$, ..., $\overline{BL}_n$ is then amplified by one of the sense amplifiers $SA_1$ through $SA_n$. Further, memory cell information amplified by the sense amplifier is selected by the column decoders and is transmitted as data $D_{out}$ via data buses DB and $\overline{DB}$ and an output buffer OB. On the other hand, write data $D_{in}$ is supplied from an external source to a write amplifier WA which is controlled by a write control circuit WCC which receives a write enable signal $\overline{WE}$. Thus, information is written into a memory cell connected between the bit line $BL_x$ selected by the column decoders $CD_1$ through $CD_n$ and the word line $WL_x$ selected by word decoders (not shown).

Figure 2:
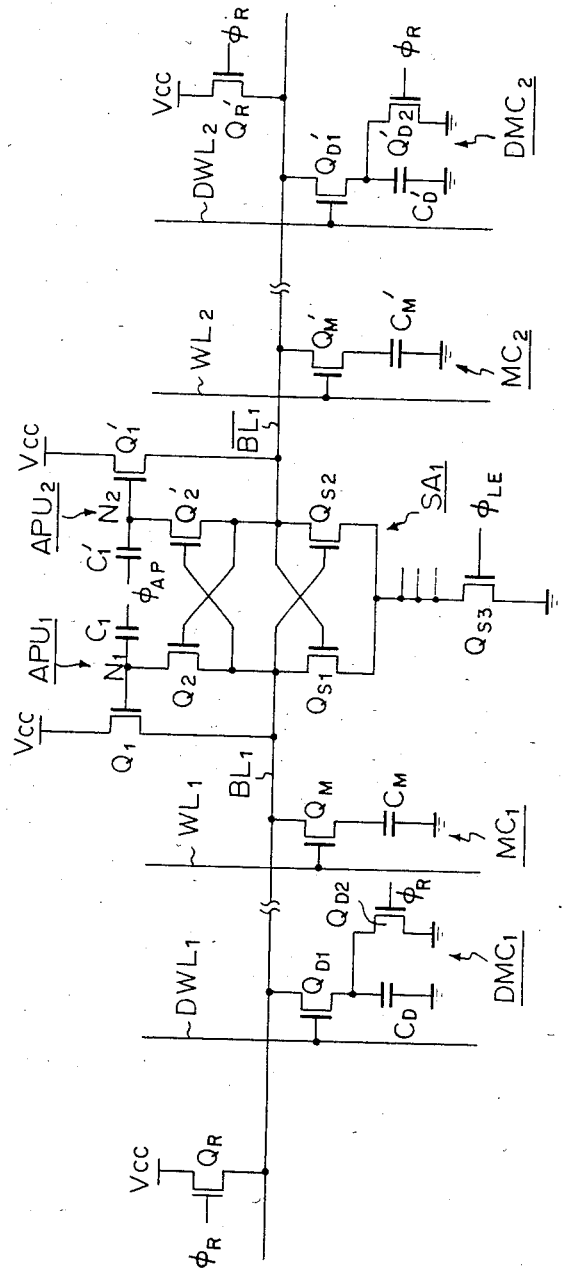
FIG. 2 is a circuit diagram of a prior art semiconductor memory device incorporating active pull-up circuits.

In FIG. 2, a circuit diagram of a semiconductor memory device incorporating a prior art active pull-up circuit, only two bit lines $BL_1$ and $\overline{BL}_1$ are illustrated. A sense amplifier $SA_1$ formed by cross-coupled transistors $Q_{S1}$ and $Q_{S2}$ is provided between the bit lines $BL_1$ and $\overline{BL}_1$. This sense amplifier $SA_1$ is controlled by the transistor $Q_{S3}$ to which it is connected in common with the other sense amplifiers.

Disposed at intersections between the word lines $WL_1$ and $WL_2$, and the bit lines $BL_1$ and $\overline{BL}_1$ are one-transistor one-capacitor type memory cells MC$_1$ and MC$_2$. In this case, each memory cell comprises one transistor Q$_M$(Q$_M'$) and one capacitor C$_M$(C$_M'$). Also, disposed at intersections between dummy word lines DWL$_1$ and DWL$_2$, and the bit lines BL$_1$ and $\overline{BL}_1$, are dummy cells DMC$_1$ and DMC$_2$. In this case, each dummy cell comprises two transistors Q$_{D1}$ and Q$_{D2}$ (Q$_{D1}'$ and Q$_{D2}'$) and one capacitor C$_D$ (C$_D'$). In addition, the capacitance of the capacitor C$_D$ (C$_D'$) in the dummy cell DMC$_1$ (DMC$_2$) is set to be almost half that of the capacitor C$_M$(C$_M'$) in the memory cells. Transistors Q$_R$ and Q$_R'$ are used for precharging the bit lines BL$_1$ and $\overline{BL}_1$.

Provided at the bit lines BL$_1$ and $\overline{BL}_1$ are active pull-up circuits APU$_1$ and APU$_2$. Each active pull-up circuit comprises three elements, i.e., a first transistor Q$_1$ connected between the power supply terminal V$_{CC}$ and the corresponding bit line BL$_1$, a second transistor Q$_2$ connected between the gate (node N$_1$) of the first transistor Q$_1$ and the companion bit line $\overline{BL}_1$, and a capacitor C$_1$ connected to the node N$_1$. The operation of the circuit shown in FIG. 2 will be explained with reference to FIGS. 3A through 3F. It will be assumed that a high level (V$_{CC}$ level) is stored in the capacitor C$_M$ of the memory cell MC$_1$.

Figure 3:
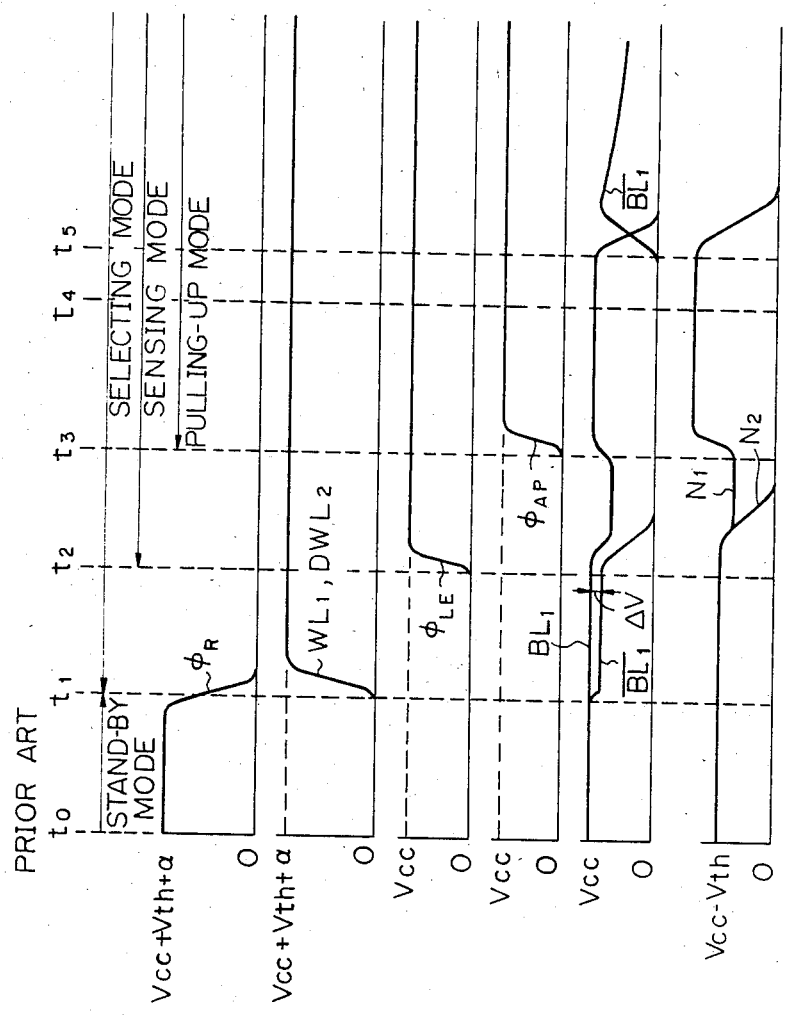
FIGS. 3A through 3F are timing diagrams of the operation of the circuit in FIG. 2.

During a stand-by mode (from t$_0$ to t$_1$), as illustrated in FIG. 3A, the reset clock signal $\phi_R$ is at V$_{CC}$+V$_{th}$+$\alpha$, where V$_{th}$ designates the common threshold voltage of the N-channel enhancement type transistors in FIG. 2. During this time, as illustrated in FIG. 3E, the bit lines BL$_1$ and $\overline{BL}_1$ are both precharged to V$_{CC}$ and the capacitors C$_D$ and C$_D'$ of the dummy cells DMC$_1$ and DMC$_2$ are discharged. Also, the potentials at the nodes N$_1$ and N$_2$ remain at V$_{CC}$−V$_{th}$.

At time t$_1$, as illustrated in FIGS. 3A and 3B, the reset clock signal $\phi_R$ is lowered from V$_{CC}$+V$_{th}$+$\alpha$ to 0V, and the word line WL$_1$ and the dummy word line DWL$_2$ are raised from 0V to V$_{CC}$+V$_{th}$+$\alpha$. As a result, the operation moves from the stand-by mode to a selecting mode. That is, the memory cell MC$_1$ is connected to the bit line BL$_1$, and the dummy cell DMC$_2$ is connected to the bit line $\overline{BL}_1$, so that the potentials of the bit lines BL$_1$ and $\overline{BL}_1$ change. However, in this case, since the capacitor C$_M$ of the memory cell MC$_1$ was already charged to V$_{CC}$, the potential of the bit line BL$_1$ remains at V$_{CC}$. On the other hand, the potential at the bit line $\overline{BL}_1$ is reduced due to the connected to the discharged capacitor C$_D'$. As a result, as illustrated in FIG. 3E, there is a very small potential difference $\Delta V$ between the bit lines BL$_1$ and $\overline{BL}_1$.

Next, at time t$_2$, as illustrated in FIG. 3C, when a latch enable signal $\phi_{LE}$ is changed from 0V to V$_{CC}$, the transistor Q$_{S3}$ is turned on so as to initiate the operation of the sense amplifier SA$_1$, so that the operation moves into a sensing mode. In this case, since the potential at the bit line BL$_1$ is larger than the potential $\overline{BL}_1$, the conductivity of the transistor Q$_{S2}$ rapidly increases reducing the lower potential, i.e., the potential of the bit line $\overline{BL}_1$, to 0V. On the other hand, since the transistor Q$_{S1}$ is turned off, the higher potential, i.e., the potential of the bit line BL$_1$, is generally not reduced, however, it is actually a little reduced as illustrated in FIG. 3E, due to the discharge by the transistor Q$_{S1}$ of the sense amplifier SA$_1$ immediately after the start of the sensing operation, the leakage currents which occur after the completion of the sensing operation, and the like. As a result, as illustrated in FIG. 3F, the potentials at the nodes N$_1$ and N$_2$ are also reduced, since these potentials follow the potentials of the bit lines BL$_1$ and $\overline{BL}_1$.

Next, at time t$_3$, as illustrated in FIG. 3D, a pull-up signal $\phi_{AP}$ is changed from 0V to V$_{CC}$, so that the operation moves into a pulling-up mode. At this time, since the transistor Q$_2$ is turned off, the potential at the node N$_1$ follows the pull-up signal $\phi_{AP}$ due to the capacitive coupling of the capacitor C$_1$. As a result, the gate potential of the transistor Q$_1$ becomes higher than V$_{CC}$, and accordingly, the potential of the bit line BL$_1$ becomes V$_{CC}$. Thus, a pulling-up operation is carried out. On the other hand, since the transistor Q$_2'$ is turned on, the potential at the node N$_2$ never increases so that the transistor Q$_1'$ is never turned on. Therefore, the potential of the bit line $\overline{BL}_1$ remains at 0V.

At time t$_5$, after the pulling-up operation is completed at time t$_4$, if a write operation of reverse data from the write amplifier WA in FIG. 1 is carried out, the transistors Q$_2$ and Q$_{S1}$ are turned on and the potential at the node N$_1$ is reduced to 0V, as illustrated in FIG. 3F. Simultaneously, the transistors Q$_2'$ and Q$_{S2}$ are rapidly turned off before the potential at the node N$_2$ is raised by the high level of the bit line $\overline{BL}_1$ through the transistor Q$_2'$. It often happens that, after the rewriting operation, charge on the bit line $\overline{BL}_1$ leaks through the transistor Q$_{S2}$ and other transistors connected to the bit line $\overline{BL}_1$ due to the effects of noise junction leakage. Therefore, as illustrated in FIG. 3E, the potential of the bit line $\overline{BL}_1$, tends to decrease gradually. Therefore, in this case a pulling-up operation is also necessary. However, it is impossible to selectively actuate the pull-up transistor Q$_1'$ even if the pull-up signal $\phi_{AP}$ is raised, because the potential at the node N$_2$ remains at 0V. Therefore, the transistor Q$_1'$ is never turned on, and accordingly, a pulling-up operation cannot be carried out. Note that, even if the pull-up signal $\phi_{AP}$ was reduced to 0V and thereafter raised to V$_{CC}$, pulling-up operation still would not be carried out in FIG. 2.

Figure 4:
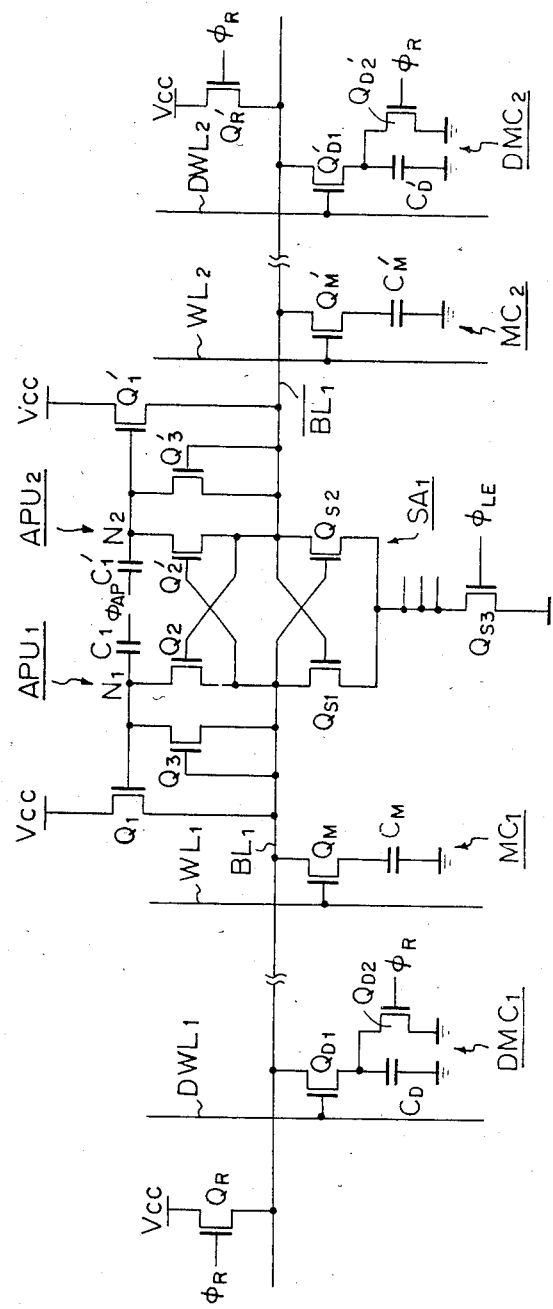
FIG. 4 is a circuit diagram of a first embodiment of a semiconductor memory device incorporating active pull-up circuits according to the present invention.

In FIG. 4, an illustration of a first embodiment of the present invention, third transistors Q$_3$ and Q$_3'$ are added to the active pulling-up circuits APU$_1$ and APU$_2$, respectively, in FIG. 2. The gates of the transistors Q$_3$ and Q$_3'$ are connected to the drains thereof, and therefore, these transistors Q$_3$ and Q$_3'$ serve as diodes. That is, transistors Q$_3$ and Q$_3'$ are turned on only when the potential of the bit lines BL$_1$ or $\overline{BL}_1$ is higher than the nodes N$_1$ or N$_2$, respectively. The presence of the transistors Q$_3$ and Q$_3'$ does not affect the usual pulling-up operation, but does affect the operation when a write operation of reverse data is carried out after or during the pulling-up operation. The operation of the circuit illustrated in FIG. 4 will be explained with reference to FIGS. 5A through 5I. FIGS. 5A through 5F correspond to FIGS. 3A to 3F, respectively, and the operation before the write operation of reverse data, i.e., before time t$_4$, is essentially the same as that of FIGS. 3A to 3F.

Figure 5:
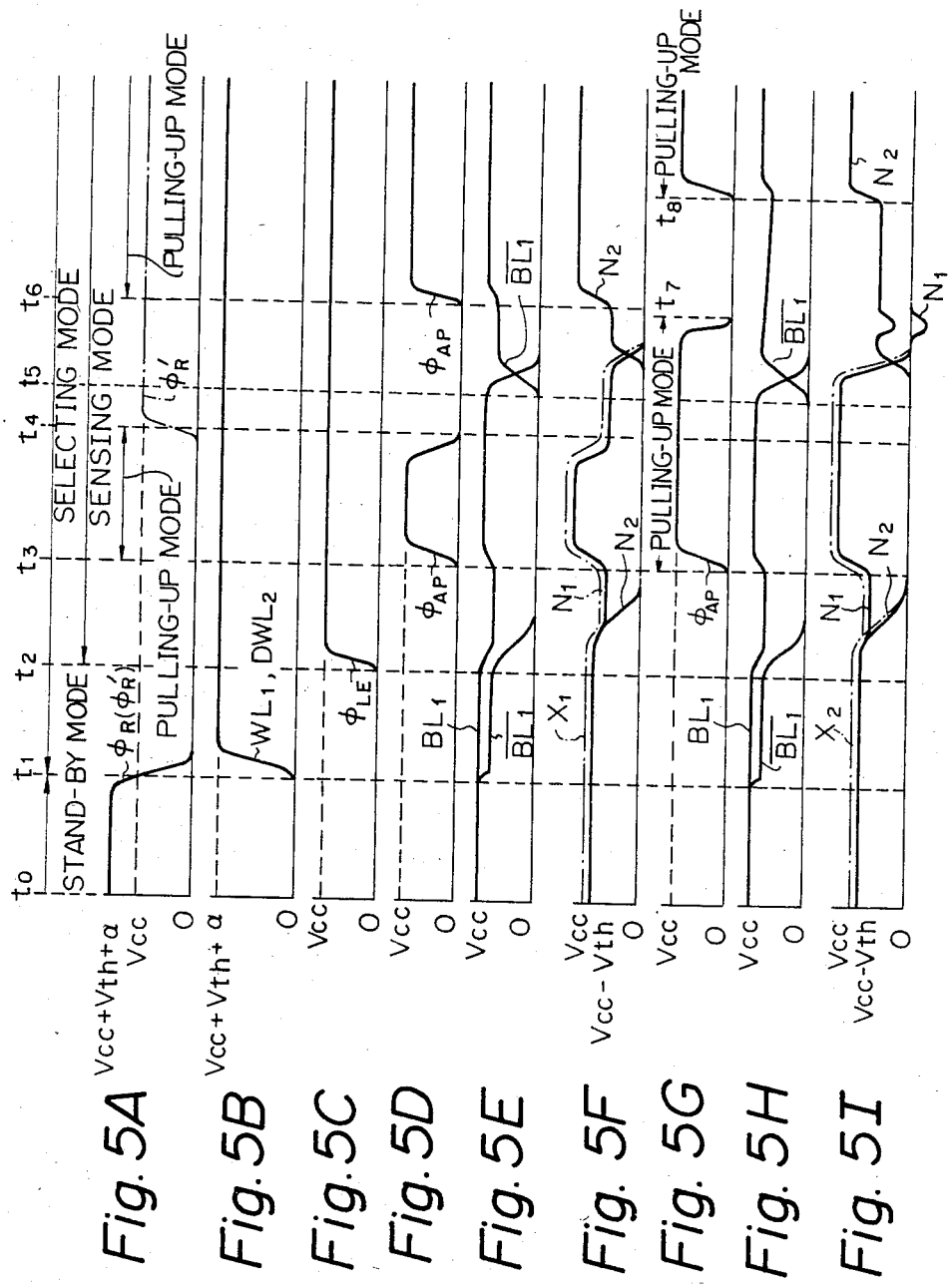
FIGS. 5A through 5I are timing diagrams of the operation of the circuit in FIG. 4.

At time t$_5$, as illustrated in FIG. 5E, when a write operation of reverse data is carried out, the potential of the bit line BL$_1$ becomes 0V to quickly turn off both of the transistors Q$_2'$ and Q$_{S2}$, so that the high level of the bit line $\overline{BL}_1$ is not transmitted to the node N$_2$ through the transistor Q$_2'$, however, the high level potential of the bit line $\overline{BL}_1$ is transmitted via the transistor Q$_3'$ to the node N$_2$. Therefore, as illustrated in FIG. 5F, the potential of node N$_2$ increases to a level which is the potential of the bit line $\overline{BL}_1$ minus V$_{th}$. Simultaneously, the transistors Q$_2$ and Q$_{S1}$ are turned on, so that the potential at the node $N_1$ decreases and the potential at the node $N_1$ becomes 0V. Thereafter in the covered in FIG. 5, the potential at the node $N_1$ never increases.

Next, at time $t_6$, when the pull-up signal $\phi_{AP}$ is again increased from 0V to $V_{CC}$, the potential at the node $N_2$ is pulled up to a level higher than $V_{CC}$ due to the capacitive coupling of the capacitor $C_1'$, as illustrated in FIG. 5F. As a result, the transistor $Q_1'$ is turned on, so that the potential of the bit line $\overline{BL_1}$ becomes $V_{CC}$, as illustrated in FIG. 5E. Thus, a pulling-up operation is carried out.

FIGS. 5G through 5I are modifications of FIGS. 5D through 5F, respectively. That is, in FIGS. 5G through 5I, a write operation of reverse data is carried out during the pulling-up operation. In FIGS. 5G through 5I, at time $t_7$, when the pull-up signal $\phi_{AP}$ is changed from $V_{CC}$ to 0V to release the pulling-up operation, the potentials at the nodes $N_1$ and $N_2$ are both temporarily reduced due to the capacitive coupling of the capacitor $C_1$ and $C_1'$, as illustrated in FIG. 5I, then returned to their previous state. Therefore, at time $t_8$, when the pull-up signal $\phi_{AP}$ is increased from 0V to $V_{CC}$, a normal pulling-up operation is carried out. Thus, even when a write operation is carried out after or during a pulling-up operation, a pulling-up operation can be carried out normally therefter.

The pull-up signal $\phi_{AP}$ depicted in FIG. 5D or 5G can be generated by a simple logic circuit. An example of such a circuit is illustrated in FIG. 6. In FIG. 6, reference numeral 61 designates a delay circuit, 62 an inverter, 63 a delay circuit, 64 an AND circuit, 65 an inverter, 66 an AND circuit, and $Q_{61}$ and $Q_{62}$ N-channel enhancement type transistors. Reference $\phi_{LE}$ designates the latch enable signal of FIG. 5C and $\overline{WE'}$ corresponds to the $\overline{Q}$ output of a flip-flop (not shown) triggered by a write enable signal $\overline{WE}$. The operation of the circuit illustrated in FIG. 6 can be easily understood from the timing diagrams in FIGS. 7A through 7I, and the detailed explanation thereof are omitted.

Figure 8:
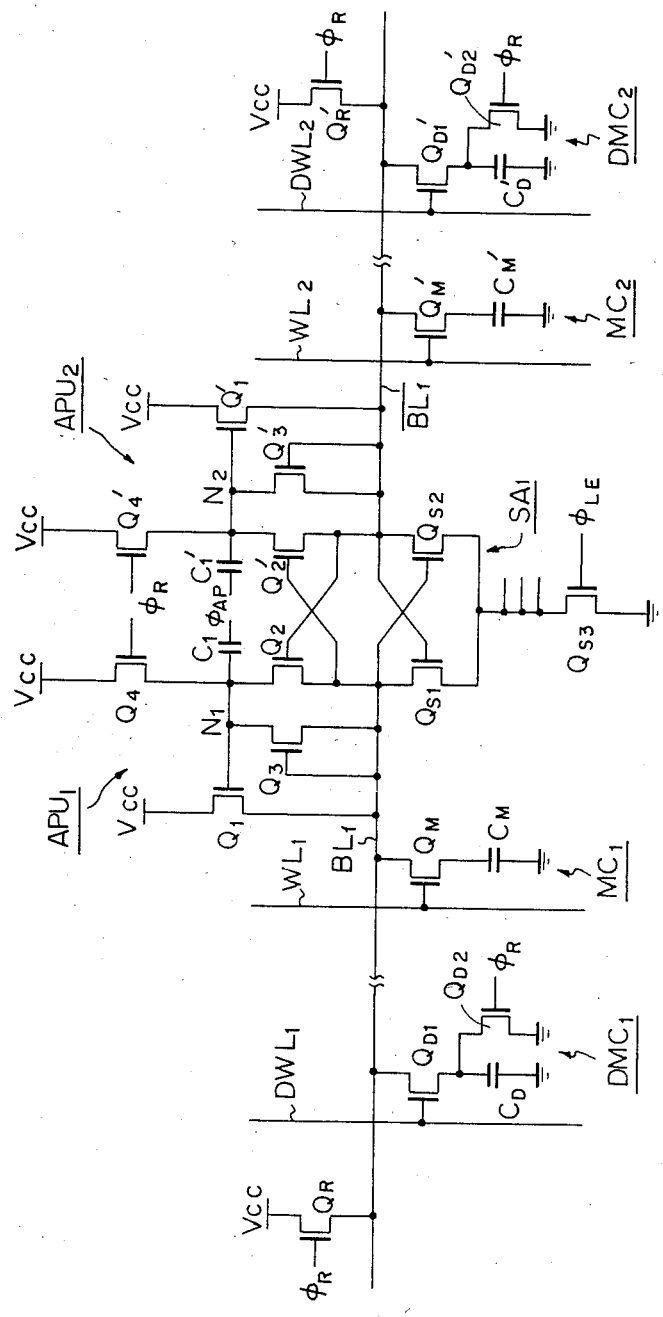
FIGS. 8 and 9 are circuit diagrams of second and third embodiments of the semiconductor memory device incorporating active pull-up circuits according to the present invention.

In FIG. 8, an illustration of a second embodiment of the present invention, fourth transistors $Q_4$ and $Q_4'$ are added to the active pull-up circuits $APU_1$ and $APU_2$, respectively, illustrated in FIG. 4. The transistors $Q_4$ and $Q_4'$ are connected between the power supply terminal $V_{CC}$ and the nodes $N_1$ and $N_2$, and the gates of these transistors receive the reset clock signal $\phi_R$. During the stand-by mode (from $t_0$ to $t_1$), the reset clock signal $\phi_R$ is $V_{CC}+V_{th}+\alpha$. Therefore, the potentials at the nodes $N_1$ and $N_2$ are both pulled up to $V_{CC}$, as indicated by $X_1$ shown in FIG. 5F or $X_2$ shown in FIG. 5I. Therefore, during the pulling-up mode (from $t_3$ to $t_4$), the increase of the potential at the node (in this case, $N_1$) due to the pulling-up signal $\phi_{AP}$ becomes larger so that a more efficient pulling-up operation is effected. In turn, this decreases the load of the clock signal $\phi_{AP}$, removing the need for a large driving power for the pulling-up signal $\phi_{AP}$.

Figure 9:
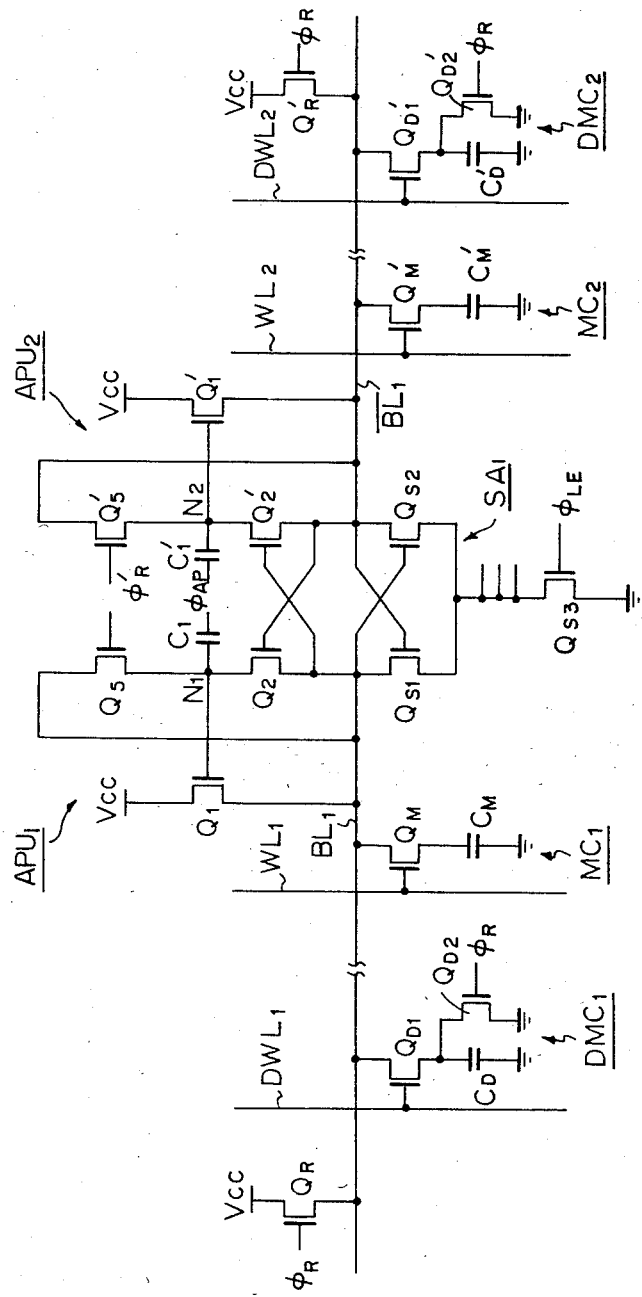

FIG. 9 illustrates a third embodiment of the present invention. In FIG. 9, fifth transistors $Q_5$ and $Q_5'$ take the place of the third transistors $Q_3$ and $Q_3'$ and the fourth transistors $Q_4$ and $Q_4'$ in FIG. 8. The gate potential of the transistors $Q_5$ and $Q_5'$ is controlled by another reset clock signal $\phi_R'$. This signal has a level equal to $V_{CC}$ at least after the writing operation of reverse data as indicated by $\phi_R'$ in FIG. 5A, in addition to a high potential during the stand-by mode.

Therefore, during the stand-by mode (from $t_0$ to $t_1$), since the potentials of the bit lines $BL_1$ and $\overline{BL_1}$ are both $V_{CC}$, and in addition, the reset clock signal $\phi_R'$ is $V_{CC}+V_{th}+\alpha$, the potentials at the nodes $N_1$ and $N_2$ become the same as those of the bit lines $BL_1$ and $\overline{BL_1}$ due to the on-state of the transistors $Q_5$ and $Q_5'$. Therefore, during the stand-by mode the transistors $Q_5$ and $Q_5'$ serve the precharging function of the transistors $Q_4$ and $Q_4'$ in FIG. 8.

In addition, when the reset clock signal $\phi_R'$ becomes $V_{CC}$, at least after the writing operation of reverse data at time $t_4$, the potentials of the bit lines $BL_1$ and $\overline{BL_1}$ are transmitted to the nodes $N_1$ and $N_2$, respectively. That is, as illustrated in FIG. 5E or 5H, when the potential of the bit line $\overline{BL_1}$ rises after the writing of reverse data, the potential at the node $N_2$ which was low, is also increased by the transistor $Q_5'$, however, it reaches $V_{CC}-V_{th}$ at most. On the other hand, the potential at the node $N_1$ remains at a low level due to the transistors $Q_2$ and $Q_5$. That is, also in this case, the higher potential, i.e., the potential of the bit line $\overline{BL_1}$ is transmitted to the node $N_2$ and in addition, the lower potential of the bit line $BL_1$ is similarly transmitted to the node $N_1$. Therefore, the transistors $Q_5$ and $Q_5'$ also serve the function of the transistors $Q_3$ and $Q_3'$ in FIG. 8. This reduces the number of transistors connected to the nodes $N_1$ and $N_2$ which act as loads when the potential at the node $N_1$ or $N_2$ is raised by the signal $\phi_{AP}$ through the capacitive coupling. The active pull-up circuit of FIG. 9 is, accordingly, advantageous in saving the amount of driving power required by the clock signal $\phi_{AP}$.

As explained hereinabove, according to the present invention, an active pulling-up operation is possible even when a write operation of reverse data is carried out.

We claim:

1. A semiconductor memory device, comprising:
   a power supply terminal;
   a plurality of pairs of bit lines;
   a plurality of sense amplifiers, each operatively connected to one pair of said pairs of bit lines, for sensing a difference in potential therebetween;
   a plurality of active pull-up circuits, each operatively, connected to an associated one of said bit lines in one of said pairs of bit lines, for pulling up a first potential level of the associated one of said bit lines, comprising:
   a first transistor having a drain operatively connected to said power supply terminal, a source operatively connected to the associated one of said bit lines and a gate;
   a second transistor having a drain operatively connected to the gate of said first transistor, a source operatively connected to the associated one of said bit lines and a gate operatively connected to the other bit line of the pair;
   a capacitor having a first terminal operatively connected to the gate of said first transistor and a second terminal;
   pull-up signal means, operatively connected to the second terminal of said capacitor, for generating an active pull-up signal; and
   transmitting means, operatively connected to the gate of said first transistor and to the associated one of said bit lines, for transmitting the first potential level of the associated one of said bit lines to the gate of said first transistor.

2. A semiconductor memory device as set forth in claim 1, wherein said semiconductor memory device receives a reset signal which has a high potential after reverse data is written, and wherein said transmitting means comprises a third transistor having a drain operatively connected to the gate of said first transistor, a source operatively connected to the associated one of said bit lines, and a gate operatively connected to receive the reset signal.

3. A semiconductor memory device as set forth in claim 1, wherein said transmitting means comprises a third transistor having a source operatively connected to the gate of said first transistor, and a gate and a drain both operatively connected to the associated one of said bit lines.

4. A semiconductor memory device as set forth in claim 3, wherein said power supply terminal is operatively connected to receive a power supply potential, further comprising reset signal means for generating a reset signal having a potential higher than the power supply potential during a stand-by mode, and wherein each of said active pull-up circuits further comprises a fourth transistor having a drain operatively connected to said power supply terminal, a source operatively connected to the gate of said first transistor and a gate operatively connected to receive the reset signal.

5. A semiconductor memory device operatively connectable to a power supply and receiving an active pull-up signal, comprising:

a memory cell including a pair of bit lines, said pair of bit lines comprising first and second bit lines;

pull-up means, operatively connected to the first bit line and connectable to receive the active pull-up signal, for pulling up the first bit line to a first poetntial level, comprising:

a first transistor operatively connected to the first bit line and connectable to the power supply, said first transistor having a control electrode;

a second transistor operatively connected to the control electrode of said first transistor and the first bit line and having a control electrode connected to the second bit line; and a capacitor having a first electrode operatively connected to said first transistor and a second electrode connectable to receive the active pull-up signal; and enabling means, operatively connected to said pull-up means and the first bit line, for enabling said pull-up means to perform a pull-up operation following a write operation for reverse data occurring immediately after a prior pull-up operation.

6. A semiconductor memory device as set forth in claim 5, further comprising a third transistor operatively connected to said first transistor and the first bit line and having a control electrode operatively connectable to receive the reset signal.

7. A semiconductor memory device as set forth in claim 5, wherein said device is operatively connectable to receive a reset signal, and further comprises a third transistor, operatively connected to said first transistor and the first bit line and having a control electrode operatively connectable to receive the reset signal, for charging the first electrode of said capacitor.

8. A semiconductor memory device as set forth in claim 7, wherein said device is operatively connectable to receive a reset signal, and wherein said pull-up means further comprises a fourth transistor, operatively connected to said first transistor and operatively connectable to the power supply, having a control electrode operatively connectable to receive the reset signal, said fourth transistor precharging said first transistor.

* * * * *

UNITED STATES PATENT AND TRADEMARK OFFICE
CERTIFICATE OF CORRECTION

PATENT NO. : 4,601,017
DATED : July 15, 1986
INVENTOR(S) : Mochizuki et al.

It is certified that error appears in the above-identified patent and that said Letters Patent is hereby corrected as shown below:

Col. 1, lines 9-10, delete ", or more broadly a metal-insulator semiconductor (MIS),";

line 11, after "(MOS)" insert --, or more broadly a metal-insulator semiconductor (MIS),--.

Col. 3, line 47, "connected" should be --connection--.

Col. 4, line 12, "$Q_2$" should be --$Q_2'$--;
line 37, after "$V_{CC}$," insert --a second--.

Col. 5, line 2, after "in the" insert --time--;
line 26, "therefter" should be --thereafter--.

Col. 7, line 38, "etntial" should be --tential--.

Signed and Sealed this

Second Day of December, 1986

*Attest:*

DONALD J. QUIGG

*Attesting Officer*      *Commissioner of Patents and Trademarks*